US010468473B2

(12) United States Patent
Kang et al.

(10) Patent No.: US 10,468,473 B2
(45) Date of Patent: Nov. 5, 2019

(54) ACTIVE LAYER, THIN-FILM TRANSISTOR ARRAY SUBSTRATE COMPRISING THE SAME, AND DISPLAY DEVICE COMPRISING THE SAME

(71) Applicant: LG Display Co., Ltd., Seoul (KR)

(72) Inventors: Jiyeon Kang, Seongnam-si (KR); Changeun Kim, Gunpo-si (KR); Jeongeun Baek, Eunpyeong-gu (KR); Sungjin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 41 days.

(21) Appl. No.: 15/389,990

(22) Filed: Dec. 23, 2016

(65) Prior Publication Data
US 2017/0194408 A1    Jul. 6, 2017

(30) Foreign Application Priority Data

Dec. 31, 2015    (KR) .................. 10-2015-0191802

(51) Int. Cl.
*H01L 27/32* (2006.01)
*H01L 51/05* (2006.01)
(Continued)

(52) U.S. Cl.
CPC ........ *H01L 27/3262* (2013.01); *G02F 1/1368* (2013.01); *H01L 27/3276* (2013.01); *H01L 29/267* (2013.01); *H01L 29/7869* (2013.01); *H01L 29/78618* (2013.01); *H01L 29/78684* (2013.01); *H01L 29/78696* (2013.01); *H01L 51/0048* (2013.01); *H01L 51/0558* (2013.01);
(Continued)

(58) Field of Classification Search
CPC ............... G02F 1/1368; H01L 51/0562; H01L 29/78696; H01L 29/267
See application file for complete search history.

(56) References Cited

U.S. PATENT DOCUMENTS

2009/0218605 A1* 9/2009 Jain ..................... H01L 29/1054
257/288
2011/0102724 A1* 5/2011 Ono .................. G02F 1/133514
349/143
(Continued)

FOREIGN PATENT DOCUMENTS

CN        104538453 A     4/2015
JP        2004-266272 A   9/2004
(Continued)

OTHER PUBLICATIONS

Japanese Office Action, dated Nov. 14, 2017 for the Japanese patent application No. 2016-243584.
(Continued)

*Primary Examiner* — Alexander P Gross
(74) *Attorney, Agent, or Firm* — Polsinelli PC

(57) ABSTRACT

Carbon allotropes, a thin-film transistor array substrate comprising the same, and a display device comprising the same are disclosed. The thin-film transistor array substrate comprising a substrate, a gate electrode on the substrate, a gate insulating film on the gate electrode, an active layer positioned on the gate insulating film and comprising a semiconductor material and a plurality of carbon allotropes, and a source electrode and a drain electrode that make contact with the active layer.

30 Claims, 10 Drawing Sheets

(51) Int. Cl.
- *H01L 29/267* (2006.01)
- *G02F 1/1368* (2006.01)
- *H01L 51/00* (2006.01)
- *H01L 51/52* (2006.01)
- *H01L 29/786* (2006.01)

(52) U.S. Cl.
CPC ...... *H01L 51/0562* (2013.01); *H01L 51/5253* (2013.01); *G02F 2201/121* (2013.01); *G02F 2201/123* (2013.01); *G02F 2202/10* (2013.01)

(56) References Cited

U.S. PATENT DOCUMENTS

| | | |
|---|---|---|
| 2012/0256168 A1 | 10/2012 | Lee et al. |
| 2014/0014905 A1* | 1/2014 | Lee .................. H01L 29/78 257/29 |
| 2014/0097403 A1 | 4/2014 | Heo et al. |
| 2015/0228804 A1 | 8/2015 | Lee et al. |
| 2015/0270324 A1* | 9/2015 | Yoneya ............... H01L 51/0533 257/40 |
| 2015/0318401 A1 | 11/2015 | Duan et al. |
| 2017/0054033 A1* | 2/2017 | Lee ................... H01L 29/78696 |

FOREIGN PATENT DOCUMENTS

| | | |
|---|---|---|
| JP | 2008-134593 A | 6/2008 |
| JP | 2011-082517 A | 4/2011 |
| JP | 2012-516053 A | 7/2012 |
| JP | 2014-197142 A | 10/2014 |
| KR | 10-0863571 B1 | 10/2008 |
| KR | 10-2011-0016287 A | 2/2011 |
| KR | 10-2011-0054386 A | 5/2011 |
| KR | 10-1400723 B1 | 5/2014 |

OTHER PUBLICATIONS

European Search Report dated May 11, 2017 in corresponding European patent application No. 16206685.

* cited by examiner (a)

(b)

<OM image>

ACTIVE LAYER, THIN-FILM TRANSISTOR ARRAY SUBSTRATE COMPRISING THE SAME, AND DISPLAY DEVICE COMPRISING THE SAME

CROSS-REFERENCE TO RELATED APPLICATION

This application claims the priority benefit of Korean Patent Application No. 10-2015-0191802 filed in the Republic of Korea on Dec. 31, 2015, which is incorporated herein by reference in its entirety for all purposes as if fully set forth herein.

BACKGROUND

Field of the Disclosure

The present disclosure relates to a display device, and more particularly, to an active layer, a thin-film transistor array substrate comprising the same, and a display device comprising the same. Although the present disclosure is suitable for a wide cope of applications, it is particularly suitable for improving device characteristics of the display device by implementing an active layer formed of carbon allotropes.

Description of the Background

With the development of multimedia, flat panel displays (FDPs) are becoming more and more important nowadays. In line with this, a variety of flat panel displays such as liquid crystal displays (LCDs), plasma display panels (PDPs), field emission displays (FEDs), organic light emitting displays (OLEDs), etc. are being put to practical use.

Display devices are addressed with either a passive-matrix addressing scheme or an active-matrix addressing scheme using thin-film transistors. In the passive-matrix addressing scheme, an anode and a cathode intersect each other and selected lines are addressed. In contrast, in the active-matrix addressing scheme, each pixel electrode is attached to a thin-film transistor and switched on or off.

For a thin-film transistor, durability and electrical reliability, which are required to ensure long lifetime, are very important, as well as the fundamental characteristics such as electron mobility and leakage current, etc. An active layer of the thin-film transistor can be one of amorphous silicon, polycrystalline silicon, and oxide semiconductor. Main advantages of amorphous silicon are a simplified deposition process and a low production cost, but it has a low electron mobility of 0.5 $cm^2/Vs$. Oxide semiconductor has an on/off ratio of about $10^8$ and a low leakage current, but with an electron mobility of 10 $cm^2/Vs$, which is lower compared to polycrystalline silicon. Polycrystalline silicon has a high electron mobility of about 100 $cm^2/Vs$, but has a lower on/off ratio compared to oxide semiconductor and it costs a lot to apply polycrystalline silicon in large-area electronics. In this regard, there is ongoing research to improve the characteristics of thin-film transistors, including electron mobility, leakage current, and on/off ratio, etc.

SUMMARY

An aspect of the present disclosure is to provide an active layer, which can improve device characteristics by comprising carbon allotropes, a thin-film transistor array substrate comprising the same, and a display device comprising the same.

In one aspect, there is provided an active layer comprising a semiconductor material and a plurality of carbon allotropes.

The active layer comprising at least one carbon allotrope part comprising the plurality of carbon allotropes, and at least one semiconducting part comprising the semiconductor material.

The carbon allotrope part comprises a plurality of domains formed by chemical bonding between the carbon atoms in the carbon allotropes.

The carbon allotropes have a one-dimensional or two-dimensional structure.

The carbon allotropes are one of reduced graphene oxide (rGO), unoxidized graphene, graphene nanoribbons, carbon nanotube, and mixtures thereof.

The semiconductor material is one of a ceramic semiconductor, an organic semiconductor material, a transition metal dichalcogenide, and a mixture thereof.

The at least one semiconducting part is positioned at least in a channel.

The at least one carbon allotrope part is positioned at least in a channel.

The at least one semiconducting part is positioned between at least two carbon allotrope parts.

The at least one carbon allotrope part is positioned between at least two semiconducting parts.

In one aspect, there is provided a thin-film transistor array substrate comprising a substrate, a gate electrode on the substrate, a gate insulating film on the gate electrode, an active layer positioned on the gate insulating film and comprising a semiconductor material and a plurality of carbon allotropes, and a source electrode and a drain electrode that make contact with the active layer.

The thin-film transistor array substrate comprising at least one carbon allotrope part comprising the plurality of carbon allotropes, and at least one semiconducting part comprising the semiconductor material.

The carbon allotrope part comprises a plurality of domains formed by chemical bonding between the carbon atoms in the carbon allotropes.

The carbon allotropes are one of reduced graphene oxide (rGO), unoxidized graphene, graphene nanoribbons, carbon nanotube, and mixtures thereof.

The semiconductor material is one of a ceramic semiconductor, an organic semiconductor material, a transition metal dichalcogenide, and a mixture thereof.

The at least one semiconducting part is positioned at least in a channel.

The at least one carbon allotrope part is positioned at least in a channel.

In one aspect, there is provided a display device comprising a thin-film transistor array substrate, an organic insulating film on the thin-film transistor array substrate, and a pixel electrode on the organic insulating film.

The display device further comprising an organic light-emitting diode electrically connected to the pixel electrode, an encapsulation layer on the organic light-emitting diode, and a cover window on the encapsulation layer.

The display device further comprising a common electrode positioned in the same plane as the pixel electrode or under the pixel electrode, spaced apart from the pixel electrode, and a liquid crystal layer on the common electrode.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
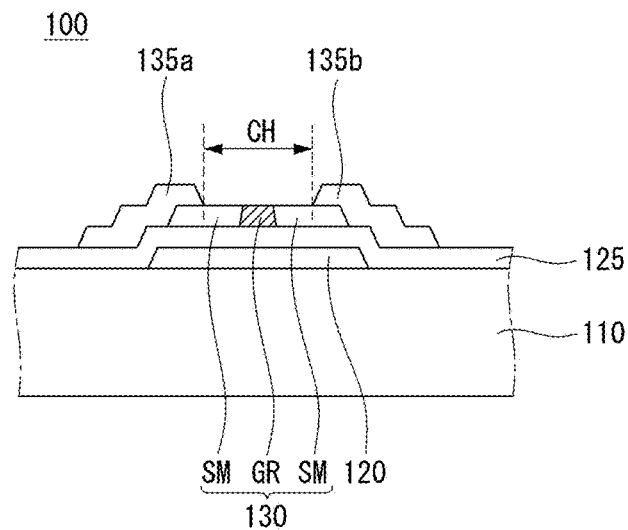
FIG. 1 is a cross-sectional view of a thin-film transistor array substrate according to an aspect of the present disclosure.

Hereinafter, exemplary aspects of the present disclosure will be described in detail with reference to the accompanying drawings. Like reference numerals designate substantially like elements throughout the specification. In the following description, detailed descriptions of well-known functions or configurations associated with the present disclosure will be omitted if they are deemed to unnecessarily obscure the subject matters of the present disclosure. The names of the elements used in the following description may be selected for ease of writing the specification, and may be different from the names of parts in actual products.

A display device according to the present disclosure to be disclosed below may be an organic light-emitting display, a liquid crystal display, an electrophoresis display, etc. The present disclosure will be described with respect to a liquid crystal display. The liquid crystal display is composed of a thin-film transistor array substrate with pixel electrodes and a common electrode formed on thin-film transistors, a color filter substrate, and a liquid crystal layer interposed between the two substrates. Such a liquid crystal display, liquid crystals are driven by an electric field vertically or horizontally applied to the common electrode and the pixel electrodes. The display device according to the present disclosure is also applicable to organic light-emitting displays. For example, an organic light-emitting display comprises first and second electrodes connected to thin-film transistors and an emissive layer of organic materials situated between the two electrodes. As such, a hole from the first electrode and an electron from the second electrode recombine within the emissive layer, forming an exciton, i.e., a hole-electron pair. Then, energy is created as the exciton returns to the ground state, thereby causing the organic light-emitting display to emit light. An active layer comprising carbon allotropes according to the present disclosure to be described later can be used for the thin-film transistors of the above display device.

Hereinafter, exemplary aspects of the present disclosure will be described with reference to the attached drawings.

The present disclosure discloses a thin-film transistor comprising carbon allotropes and a semiconductor material, and more particularly, a thin-film transistor with an active layer comprising carbon allotropes and a semiconductor material. The thin-film transistor is used as a switching element or driving element for a display device.

Carbon Allotropes

Carbon allotropes disclosed in the present disclosure refer to polycyclic aromatic molecules of covalently bonded carbon atoms. Covalently bonded carbon atoms are in repeating units, which may form a ring of 6 elements. Also, the covalently bonded carbon atoms may comprise either a ring of 5 elements or a ring of 6 elements or both of them. The carbon allotropes may be a single layer, or may comprise multiple layers of carbon allotropes stacked on one another. The carbon allotropes have a one-dimensional or two-dimensional structure. The carbon allotropes have a maximum thickness of about 100 nm, specifically, about 10 nm to 90 nm, or about 20 nm to 80 nm.

Carbon allotropes can be produced by the following four methods: physical peeling, chemical vapor deposition, chemical peeling and epitaxial growth. The physical peeling is a method of producing carbon allotrope sheets by applying Scotch tape to a graphite sample and then peeling it off. In the chemical vapor deposition, gaseous or vaporous carbon precursors with high kinetic energy adsorb on the surface of a substrate where carbon allotropes are to be grown, and then decompose into carbon atoms. These carbon atoms are packed together, thus growing crystalline allotropes of carbon. The chemical peeling uses the oxidation-reduction property of graphite, in which graphite is treated with an acidic mixture of sulfuric acid and nitric acid to produce carbon allotrope plates with carboxyl groups at their edges. These are converted to acid chlorides by treatment with thionyl chloride; next, they are converted to the corresponding graphene amide via treatment with octadecylamine Refluxing the resulting material in a solvent such as tetrahydrofurane leads to size reduction and folding of individual sheets of carbon allotrope sheets. In the epitaxial synthesis, silicon carbide (SiC) is heated to a high temperature of 1,500° C. to remove silicon (Si), and the remaining carbon atoms C form a carbon allotrope.

Carbon allotropes of this disclosure may include one of reduced graphene oxide (rGO), unoxidized graphene, graphene nanoribbons, carbon nanotube (CNT) and mixtures thereof. The reduced graphene oxide is a reduced form of graphene oxide (GO), which is obtained by oxidizing graphite with a strong acid, chemically processing it to make tiny particles of graphene oxide, and then reducing these particles of graphene oxide. Unoxidized graphene refers to graphene which is produced by any of the above-mentioned carbon allotrope production methods, but without the oxidation-reduction process. Graphene nanoribbons are strips of graphene that measure in nanometers, exhibiting a different energy bandgap depending on their width. Graphene nanoribbons can be made by synthesis from monomers comprising carbon allotropes or by cutting carbon nanotubes and opening them up flat. Besides the above mentioned types of graphene, carbon allotropes of this invention may have well-known graphene structures such as graphene nanomeshes.

Carbon allotropes of this disclosure come in the shape of flakes. Carbon allotrope flakes can be produced by coating a substrate with a dispersion solution with carbon allotropes dispersed in a solvent, drying the solvent, and then applying a physical force to the coating. The physical force can be applied by using a ball mill, bead mill, and ultrasonic homegenizer, etc.

Semiconductor Material

A semiconductor materials used in this disclosure may be a ceramic semiconductor, organic semiconductor material, or transition metal dichalcogenide that exhibits semiconducting properties.

Ceramic semiconductors are materials that use the electrical properties of ceramics. In the case of ceramics, electrons are held in ions or atoms, so they are not free to move, leading to conduction of almost no electricity. However, when an electric field is applied from the outside, the held electrons are re-arranged by reacting with the electric field, making the electrons change state and move. Ceramic semiconductors include oxides, carbides, and nitrides, which are produced by bonding metal elements such as silicon (Si), germanium (Ge), selenium (Se), aluminum (Al), titanium (Ti), and zirconium (Zr) to oxygen (O), carbon (C), nitrogen (N), etc. One of the most common ceramic semiconductors is barium titanate (BaTiO3).

Organic semiconductors are organic compounds with semiconducting properties, which include polymer organic semiconductors and low-molecular organic semiconductors. The polymer organic semiconductors may include F8T2 (Poly[(9,9-dioctylfluorenyl-2,7-diyl)-co-bithiophene]), PBDTBOTPDO(Poly[(5,6-dihydro-5-octyl-4,6-dioxo-4H-thieno[3,4-C]pyrrole-1,3-diyl){4,8-bis[(2-butyloctyl)oxy [benzo[1,2-b:4,5-b']dithiophene-2,6-diyl}]), PBDT-TPD (Poly[[5-(2-ethylhexyl)-5,6-dihydro-4,6-dioxo-4H-thieno [3,4-c]pyrrole-1,3-diyl][4,8-bis[(2-ethylhexyl)oxy[benzo[1, 2-b:4,5-b']dithiophene-2,6-diyl]]), PBDTTT-CF(Poly[1-(6-{4,8-bis[(2-ethylhexyl)oxy]-6-methylbenzo[1,2-b:4,5-b'] dithiophen-2-yl}-3-fluoro-4-methylthieno[3,4-b]thiophen-2-yl)-1-octanone]), PCDTBT(Poly[N-9'-heptadecanyl-2,7-carbazole-alt-5,5-(4',7'-di-2-thienyl-2',1',3'-benzothiadiazole)], Poly[[9-(1-octylnonyl)-9H-carbazole-2, 7-diyl]-2,5-thiophenediyl-2,1,3-benzothiadiazole-4,7-diyl-2,5-thiophenediyl]), PCPDTBT(Poly[2,6-(4,4-bis-(2-ethylhexyl)-4H-cyclopenta[2,1-b;3,4-b']dithiophene)-alt-4, 7(2,1,3-benzothiadiazole)]), PFO-DBT(Poly[2,7-(9,9-dioctylfluorene)-alt-4,7-bis(thiophen-2-yl)benzo-2,1,3-thiadiazole]), PTAA(Poly[bis(4-phenyl)(2,4,6-trimethylphenyl)amine]), Poly[(5,6-dihydro-5-octyl-4,6-dioxo-4H-thieno[3,4-c]pyrrole-1,3-diyl)[4,8-bis[(2-ethylhexyl)oxy]benzo[1,2-b:4,5-b']dithiophene-2,6-diyl]], F8BT(Poly[(9,9-di-n-octylfluorenyl-2,7-diyl)-alt-(benzo[2, 1,3]thiadiazol-4,8-diyl)]), P3DDT(Poly(3-dodecylthiophene-2,5-diyl)), P3HT(Poly(3-hexylthiophene-2,5-diyl)), MDMOPPV(Poly[2-methoxy-5-(3',7'-dimethyloctyloxy)-1, 4-phenylenevinylene]), MEH-PPV(Poly[2-methoxy-5-(2-ethylhexyloxy)-1,4-phenylenevinylene]), P3OT(Poly(3-octylthiophene-2,5-diyl)), and PTB7(Poly({4,8-bis[(2-ethylhexyl)oxy]benzo[1,2-b:4,5-b']dithiophene-2,6-diyl} [3-fluoro-2-[(2-ethylhexyl)carbonyl]thieno[3,4-b]thiophenediyl})).

The low-molecular organic semiconductors may include TIPS-pentacene(6,13-Bis(triisopropylsilylethynyl)pentacene), TESPentacene(6,13-Bis((triethylsilyl)ethynyl)pentacene), DH-FTTF(5,5'-Bis(7-hexyl-9H-fluoren-2-yl)-2,2'-bithiophene), diF-TES-ADT(2,8-Difluoro-5,11-bis (triethylsilylethynyl)anthradithiophene), DH2T(5,5'-Dihexyl-2,2'-bithiophene), DH4T(3,3'''-Dihexyl-2,2':5',2'': 5'',2'''-quaterthiophene), DH6T(5,5'''''-Dihexyl-2,2':5',2'':5'', 2''':5''',2'''':5'''',2'''''-sexithiophene), DTS(PTTh2)2(4,4'-[4,4-Bis(2-ethylhexyl)-4H-silolo[3,2-b:4,5-b']dithiophene-2,6-diyl[bis[7-(5'-hexyl-[2,2'-bithiophen]-5-yl)-[1,2,5] thiadiazolo[3,4-c]pyridine], 5,5'-Bis{[4-(7-hexylthiophen-2-yl)thiophen-2-yl]-[1,2,5]thiadiazolo[3,4-c]pyridine}-3,3'-di-2-ethylhexylsilylene-2,2'-bithiophene), SMDPPEH(2,5-Di-(2-ethylhexyl)-3,6-bis-(5''-n-hexyl-[2,2',5',2''] terthiophen-5-yl)-pyrrolo[3,4-c]pyrrole-1,4-dione), and TES-ADT(5,11-Bis(triethylsilylethynyl)anthradithiophene).

As the above-mentioned organic semiconductor of the present disclosure, two or more types of polymer or low-molecular organic semiconductors may be used, or different types of polymer organic semiconductors may be used, or different types of low-molecular organic semiconductors may be used.

Transition metal dichalcogenides are materials with semiconducting properties, for example, transition metal sulfides, transition metal selenides, transition metal tellurides, etc. Examples of transition metal dichalcogenides include SnSE2, CdSe, ZnSe, ZnTe, MoS2, MoSe2, MoTE2, WS2, WSe2, WTe2, etc.

Hereinafter, a thin-film transistor comprising an active layer comprising the above-described carbon allotropes and a semiconductor material and a display device comprising the same will be described.

Figure 8:
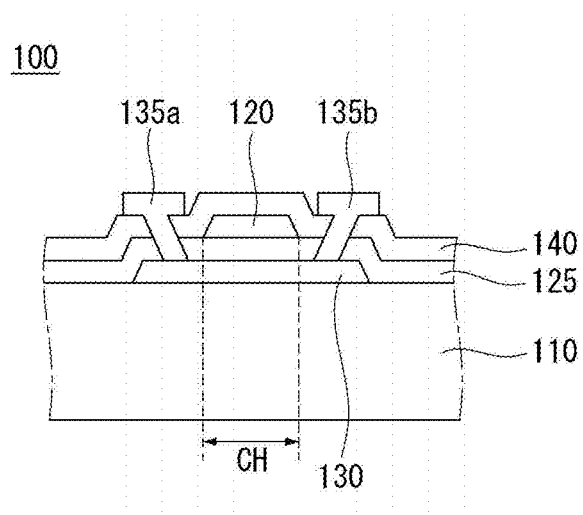
FIG. 8 is a cross-sectional view of a thin-film transistor array substrate according to another aspect of the present disclosure.
Figure 9:
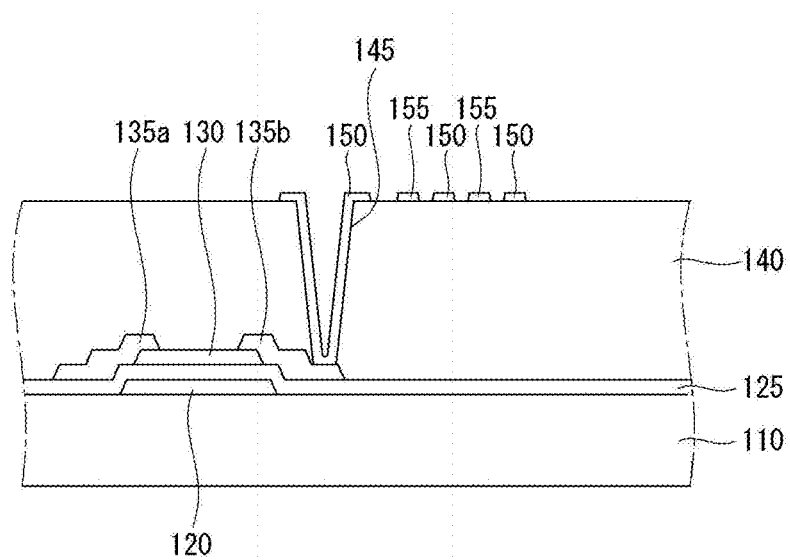
FIGS. 9 and 10 are cross-sectional views of a display device according to an aspect of the present disclosure.
Figure 10:
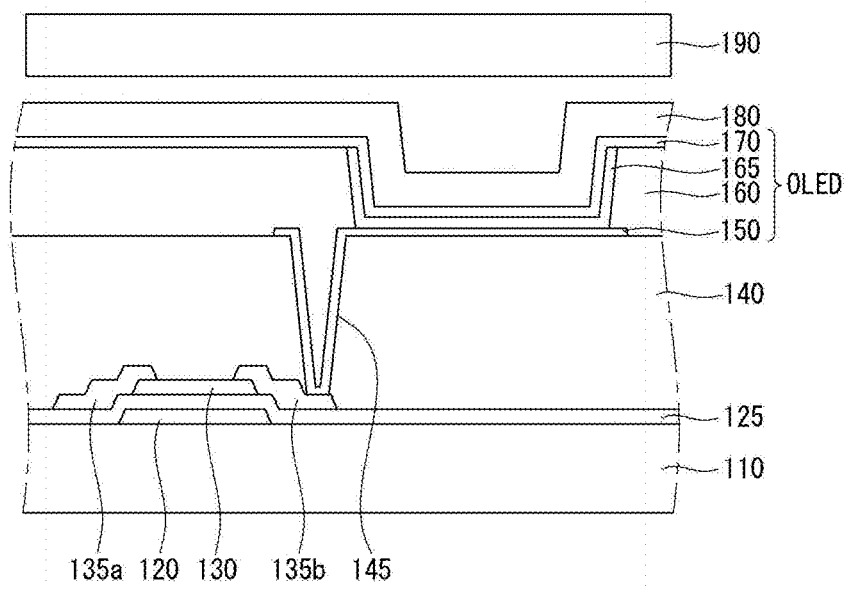

FIG. 1 is a cross-sectional view of a thin-film transistor array substrate according to a first exemplary embodiment of the present disclosure. FIGS. 2 to 7 are views showing various cross-sections and planes of an active layer according to the present disclosure. FIG. 8 is a cross-sectional view of a thin-film transistor array substrate according to a second exemplary embodiment of the present disclosure. FIGS. 9 and 10 are cross-sectional views of a display device according to an exemplary embodiment of the present disclosure.

Thin-Film Transistor Array Substrate

A thin-film transistor array substrate disclosed in the present disclosure will be described with respect to a bottom-gate type thin-film transistor with a gate electrode positioned under an active layer. However, the present disclosure is not limited to this but also applicable to a top-gate type thin-film transistor with a gate electrode positioned over an active layer.

Referring to FIG. 1, in the case of the thin-film transistor array substrate 100 according to an aspect of the present disclosure, a gate electrode 120 is positioned on a substrate 110. The substrate 110 is made of transparent or opaque glass, plastic, or metal. The gate electrode 120 is composed of a single layer or multiple layers of one of copper (Cu), molybdenum (Mo), aluminum (Al), chrome (Cr), gold (Au), silver (Ag), titanium (Ti), nickel (Ni), neodymium (Nd), tantalum (Ta), and tungsten (W), or alloys thereof. A gate insulating film 125 for insulating the gate electrode 120 is positioned on the gate electrode 120. The gate insulating film 125 may be formed of one of a silicon oxide film (SiOx), a silicon nitride film (SiNx), and multiple layers thereof.

An active layer 130 is positioned over the gate electrode 120. The active layer 130 may be formed of carbon allotropes of this disclosure and a semiconductor material. More specifically, a semiconducting part SM is formed by forming a semiconductor material on the substrate 110 where the gate insulating film 125 is formed. The semiconductor material may be formed by a chemical or physical deposition or by a solution coating. The semiconducting part SM is formed, with space left for a carbon allotrope part to be described later. Next, a carbon allotrope part GR is formed by coating a carbon allotrope solution on the substrate 110 where the semiconducting part SM is formed. The carbon allotrope solution may be applied by one of spin coating, slit coating, screen printing, and ink-jet printing, etc., and any method can be used as long as it involves coating a solution. The solvent is removed by heating the carbon allotrope thin film coating to 250° C. for 2 hours, and then the carbon allotrope thin film coating is patterned by photolithography, thus forming the carbon allotrope part GR. Hence, the active layer 130 of this disclosure may comprise the semiconducting part SM and the carbon allotrope part GR. A more detailed structure of the active layer 130 will be described below.

Meanwhile, a source electrode 135a making contact with one side of the active layer 130 and a drain electrode 135b making contact with the other side of the active layer 130 are positioned on the active layer 130. The source electrode 135a and the drain electrode 135b may be composed of a single layer or multiple layers. The source electrode 135a and the drain electrode 135b, if composed of a single layer, may be formed of one of molybdenum (Mo), aluminum (Al), chrome (Cr), gold (Au), silver (Ag), titanium (Ti), nickel (Ni), neodymium (Nd), copper (Cu), and alloys thereof. The source electrode 135a and the drain electrode 135b, if composed of multiple layers, may be formed of two layers of molybdenum-titanium(MoTi)/copper, molybdenum/aluminum-neodymium, molybdenum/aluminum, gold/titanium, or titanium/aluminum, or three layers of molybdenum/aluminum-neodymium/molybdenum, molybdenum/aluminum/molybdenum, or titanium/aluminum/titanium.

The active layer 130 of this disclosure has a channel CH between the contact areas with the source electrode 135a and the drain electrode 135b. The channel CH is a path in the active layer 130 through which electrons and holes move between the source electrode 135a and the drain electrode 135b.

Figure 2:
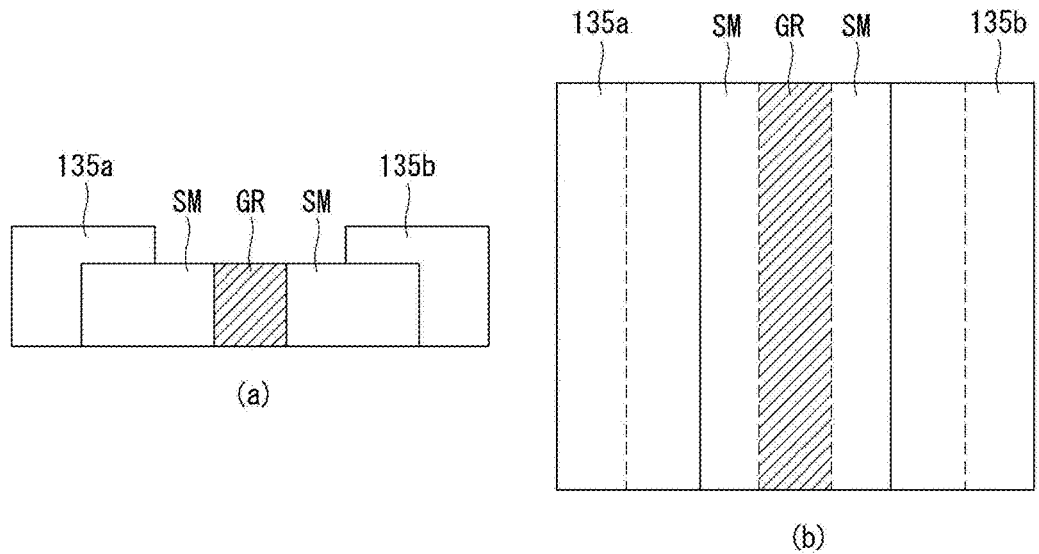
FIGS. 2 to 7 are views showing various cross-sections and planes of an active layer according to the present disclosure.

Referring to FIG. 2, the active layer 130 of this disclosure comprises a semiconducting part SM consisting of a semiconductor material and a carbon allotrope part GR consisting of carbon allotropes. The carbon allotrope part GR may comprise a plurality of domains formed by chemical bonding between the carbon atoms in the carbon allotropes.

For instance, the active layer 130 may be formed in such a shape that a carbon allotrope part GR is positioned between semiconducting parts SM. The semiconducting parts SM make contact with the source electrode 135a and the drain electrode 135b, and the carbon allotrope GR is positioned between the semiconducting parts SM. The carbon allotrope part GR is spaced apart from the source electrode 135a and the drain electrode 135b.

Thus, when a voltage is applied to the source electrode 135a and the drain electrode 135b, electrons and holes move to the channel in the active layer 130. Since the semiconducting parts SM and the carbon allotrope part GR are positioned at the channel in the active layer 130, the electrons and the holes in the semiconducting parts SM can move in proportion to the charge mobility of the semiconductor material and then move very fast in the carbon allotrope part GR, which is near-conductive. That is, as electrons and holes move along the semiconducting parts SM and the carbon allotrope part GR, the charge mobility can be improved greatly. Notably, in the case of semiconductor materials, scattering happens when electrons move, which leads to a low electron mobility. In contrast, scattering rarely occurs within carbon allotropes and this eliminates the risk of a decrease in electron mobility.

Figure 3:
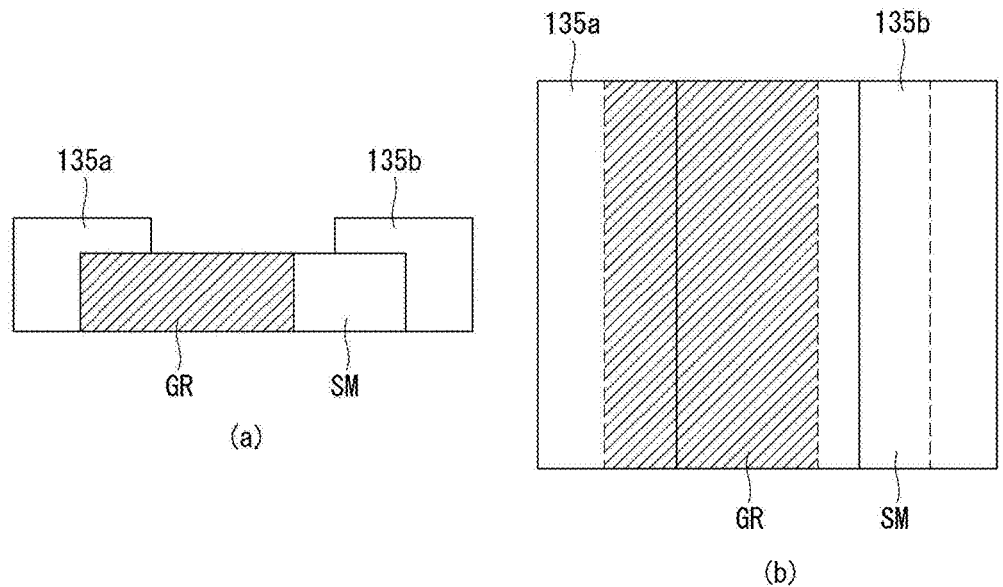

Meanwhile, referring to FIG. 3, the active layer 130 of this disclosure may comprise a carbon allotrope part GR in contact with the source electrode 135a and a semiconducting part SM in contact with the drain electrode 135b. In this case, the carbon allotrope part GR extends more than half of the length of the active layer 130 from the source electrode 135a, and the semiconducting part SM extends the length of the remaining part of the active layer 130 from the drain electrode 135b. In this case, the active layer 130 may act as a semiconductor since the carbon allotrope part GR and the semiconducting part SM are positioned at the channel in the active layer 130.

Figure 4:
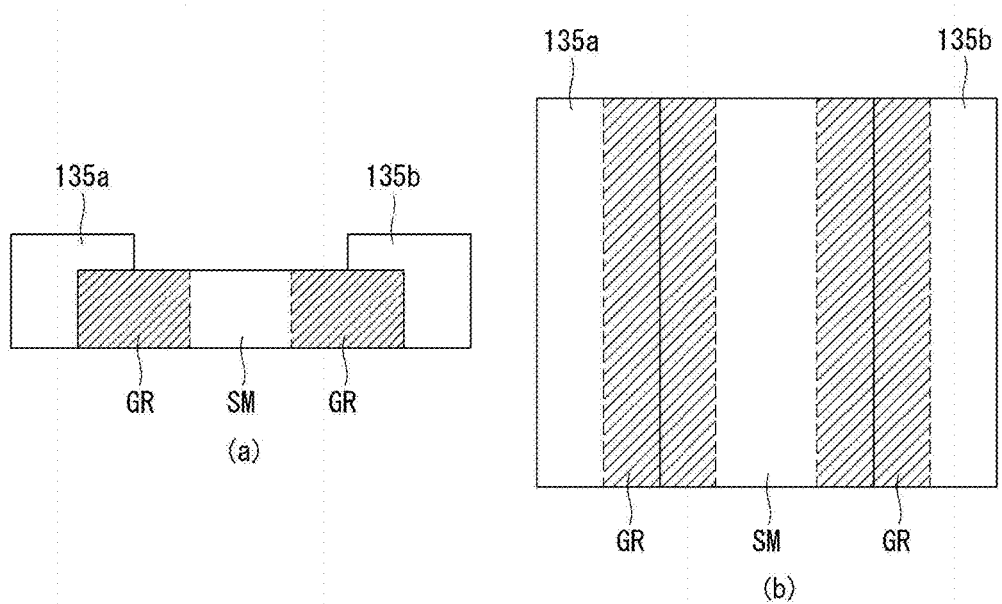

Moreover, referring to FIG. 4, the active layer 130 of this disclosure may comprise carbon allotrope parts GR in contact with both the source electrode 135a and the drain electrode 135b, and a semiconducting part SM positioned between the carbon allotrope parts GR. That is, the positions of the carbon allotrope part GR and the semiconducting part SM in the above structure of FIG. 2 may be reversed. The semiconducting part SM is positioned between the carbon allotrope parts GR and therefore exists only within the channel. In this case, the active layer 130 may act as a semiconductor since the carbon allotrope parts GR and the semiconducting part SM are positioned at the channel in the active layer 130.

Figure 5:
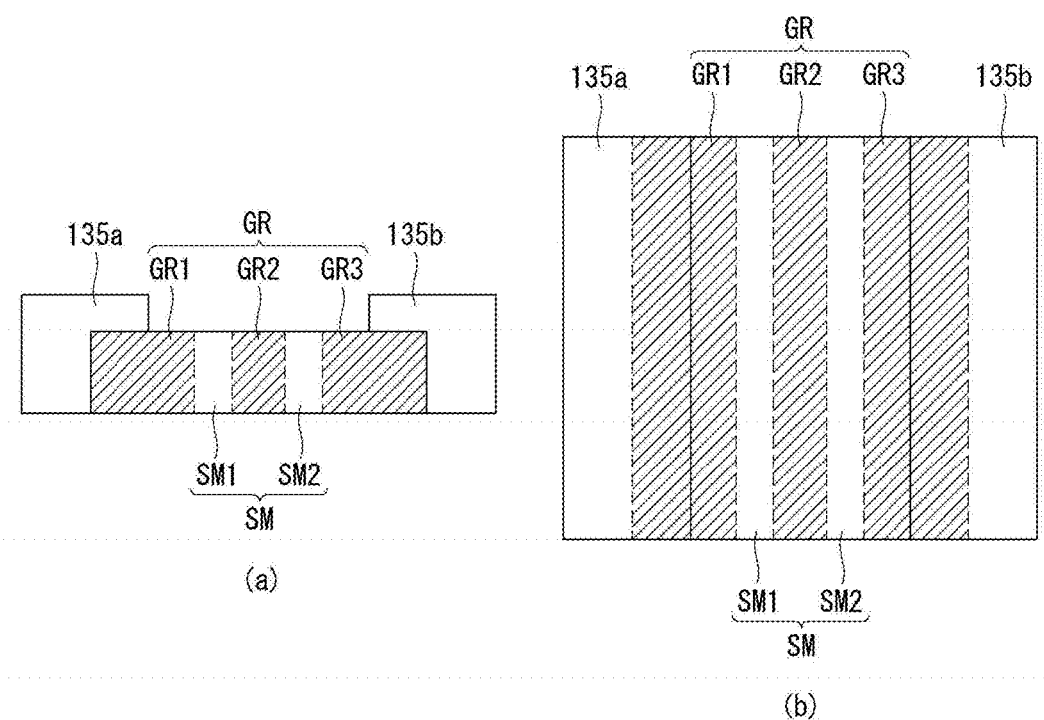

In addition, referring to FIG. 5, in the active layer 130 of this disclosure, the carbon allotrope part GR and the semiconductor part SM may be formed alternately. More specifically, a first carbon allotrope part GR1 may be positioned to make contact with the source electrode 135a, and a third carbon allotrope part GR3 may be positioned to make contact with the drain electrode 135b. A second carbon allotrope part GR2 is positioned between the first carbon allotrope part GR1 and the third carbon allotrope part GR3, spaced apart from them. A first semiconducting part SM1 is positioned between the first carbon allotrope part GR1 and the second carbon allotrope part GR2, and a second semiconducting part SM2 is positioned between the second carbon allotrope part GR2 and the third carbon allotrope part GR3. That is, the first carbon allotrope part GR1, the first semiconducting part SM1, the second carbon allotrope part GR2, the second semiconducting part SM2, and the third carbon allotrope part GR3 are arranged in sequence in the active layer 130, from the source electrode 135a towards the drain electrode 135b.

As such, the first carbon allotrope part GR1, the first semiconducting part SM1, the second carbon allotrope part GR2, the second semiconducting part SM2, and the third carbon allotrope part GR3 are positioned at the channel in the active layer 130, thus allowing the active layer 130 to act as a semiconductor.

Figure 6:
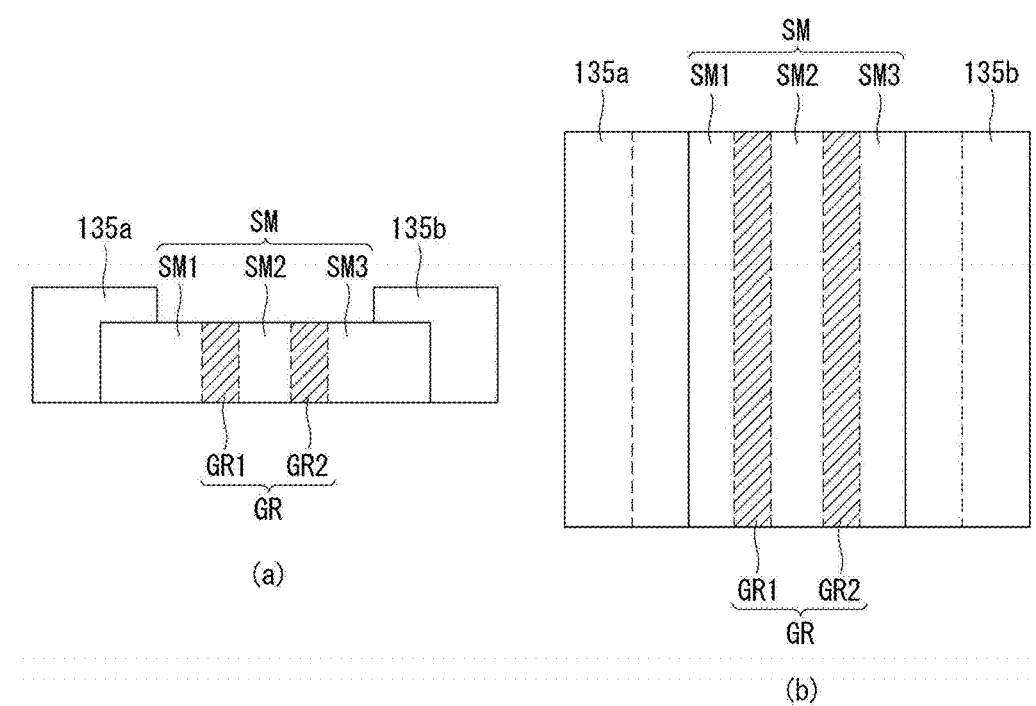

Furthermore, referring to FIG. 6, in the active layer 130 of this disclosure, the carbon allotrope part GR and the semiconductor part SM may be formed alternately. More specifically, a first semiconducting part SM1 may be positioned to make contact with the source electrode 135a, and a third semiconducting part SM3 may be positioned to make contact with the drain electrode 135b. A second semiconducting part SM2 is positioned between the first semiconducting part SM1 and the third semiconducting part SM3, spaced apart from them. A first carbon allotrope part GR1 is positioned between the first semiconducting part SM1 and the second semiconducting part SM2, and a second carbon allotrope part GR2 is positioned between the second semiconducting part SM2 and the third semiconducting part SM3. The first semiconducting part SM1, first carbon allotrope part GR1, second semiconducting part SM2, second carbon allotrope part GR2, and third semiconducting part SM3 are arranged in sequence in the active layer 130, from the source electrode 135a towards the drain electrode 135b.

That is, the positions of the carbon allotrope part and semiconducting part in the above structure of FIG. 5 may be reversed.

As such, the first semiconducting part SM1, the first carbon allotrope part GR1, the second semiconducting part SM2, the second carbon allotrope part GR2, and the third semiconducting part SM2 are positioned at the channel in the active layer 130, thus allowing the active layer 130 to act as a semiconductor.

Figure 7:
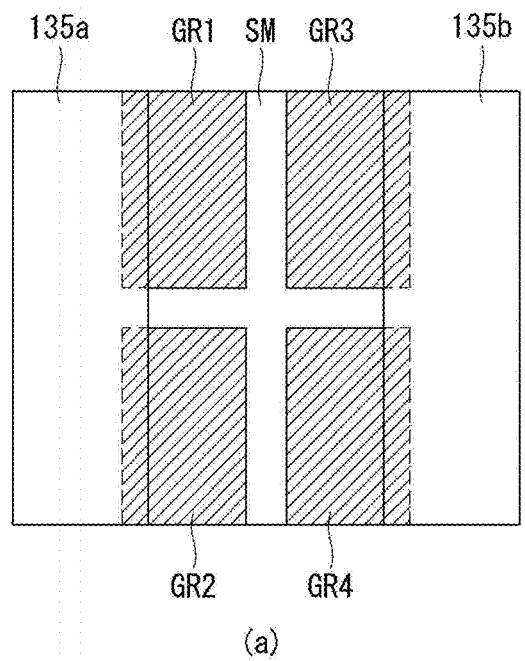
Figure 7:
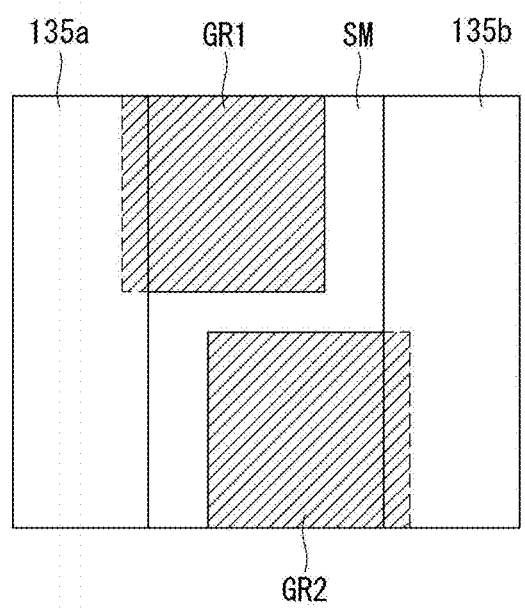

Furthermore, referring to (a) of FIG. 7, the active layer 130 of this disclosure comprises a plurality of carbon allotrope parts GR1, GR2, GR3, and GR4 and a semiconducting part SM positioned between the carbon allotrope parts GR1, GR2, GR3, and GR4. More specifically, a first carbon allotrope part GR1 is positioned to make contact with an upper part of the source electrode 135*a*, and a second carbon allotrope part GR2 is positioned to make contact with a lower part of the source electrode 135*a*, spaced apart from the first carbon allotrope part GR1. A third carbon allotrope part GR3 is positioned to make contact with an upper part of the drain electrode 135*b*, and a fourth carbon allotrope part GR4 is positioned to make contact with a lower part of the drain electrode 135*b*, spaced apart from the third carbon allotrope part GR3. The third carbon allotrope part GR3 is spaced apart from the first carbon allotrope part GR1 adjacent to it, and the fourth carbon allotrope part GR4 is spaced apart from the second carbon allotrope part GR2 adjacent to it. The semiconducting part SM is positioned in the remaining space between the first carbon allotrope part GR1, the second carbon allotrope part GR2, the third carbon allotrope part GR3, and the fourth carbon allotrope part GR4.

In this case, the first carbon allotrope part GR1, the semiconducting part SM, and the third carbon allotrope part GR2 are arranged in sequence in an upper part of the active layer 130, from the source electrode 135*a* towards the drain electrode 135*b*. Only the semiconducting part SM is arranged along the center of the active layer 130, from the source electrode 135*a* towards the drain electrode 135*b*. The second carbon allotrope part GR2, the semiconducting part SM, and the fourth carbon allotrope part GR4 are arranged in sequence in a lower part of the active layer 130, from the source electrode 135*a* towards the drain electrode 135*b*.

Thus, since the semiconducting part SM and the first to fourth carbon allotrope parts GR1, GR2, GR3, and GR4 are positioned at the channel in the active layer 130, the electrons and the holes in the semiconducting part SM can move in proportion to the charge mobility of the semiconductor material and then move very fast in the first to fourth carbon allotrope parts GR1, GR2, GR3, and GR4 which are near-conductive. That is, as electrons and holes move along the semiconducting part SM and the first to fourth carbon allotrope parts GR1, GR2, GR3, and GR4, the charge mobility can be improved greatly.

Furthermore, referring to (b) of FIG. 7, the active layer 130 of this disclosure comprises a plurality of carbon allotrope parts GR1 and GR2 and a semiconducting part SM positioned between the carbon allotrope parts GR1 and GR2. More specifically, a first carbon allotrope part GR1 is positioned to make contact with an upper part of the source electrode 135*a*, and a second carbon allotrope part GR2 is positioned to make contact with a lower part of the drain electrode 135*b*. The first carbon allotrope part GR2 and the second carbon allotrope part GR2 are spaced apart from each other, and the semiconducting part SM is positioned in the remaining space between the first carbon allotrope part GR1 and the second carbon allotrope part GR2.

In this case, the first carbon allotrope part GR1 and the semiconducting part SM are arranged in sequence in an upper part of the active layer 130, from the source electrode 135*a* towards the drain electrode 135*b*. Only the semiconducting part SM is arranged along the center of the active layer 130, from the source electrode 135*a* towards the drain electrode 135*b*. The semiconducting part SM and the second carbon allotrope part GR2 are arranged in sequence in a lower part of the active layer 130, from the source electrode 135*a* towards the drain electrode 135*b*.

Thus, since the semiconducting part SM and the first and second carbon allotrope parts GR1 and GR2 are positioned at the channel in the active layer 130, the electrons and the holes in the semiconducting part SM can move in proportion to the charge mobility of the semiconductor material and then move very fast in the first and second carbon allotrope parts GR1 and GR2 which are near-conductive. That is, as electrons and holes move along the semiconducting part SM and the first and second carbon allotrope parts GR1 and GR2, the charge mobility can be improved greatly.

As described above, in the present disclosure, since the semiconducting part SM and the carbon allotrope part GR are included in the channel in the active layer 130, the electrons and the holes in the semiconducting part SM can move in proportion to the charge mobility of the semiconductor material and then move very fast in the carbon allotrope part GR, which is near-conductive. That is, as electrons and holes move along the semiconducting part SM and the carbon allotrope part GR, the charge mobility can be improved greatly. Notably, in the case of semiconductor materials, scattering happens when electrons move, which leads to a low electron mobility. In contrast, scattering rarely occurs within carbon allotropes and this eliminates the risk of a decrease in electron mobility.

Meanwhile, referring to FIG. 8, a thin-film transistor array substrate 100 according to another aspect of the present disclosure comprises a top-gate type thin-film transistor, unlike the foregoing aspect shown in FIG. 1. The same components as the foregoing aspect of the disclosure are denoted by the same reference numerals, and only a brief description of them will be given.

As shown in FIG. 8, in the case of the thin-film transistor array substrate 100 according to another aspect of the present disclosure, an active layer 130 is positioned on a substrate 110. The active layer 130 comprises a semiconducting part 130 and a carbon allotrope part, as with the foregoing aspect of the disclosure, so a description thereof will be omitted. A gate insulating film 125 is positioned on the active layer 130. The gate insulating film 125 may be formed of a silicon oxide film (SiOx), a silicon nitride film (SiNx), or multiple layers thereof. A gate electrode 120 is positioned on the gate insulating film 125. The gate electrode 120 is composed of a single layer or multiple layers of one of copper (Cu), molybdenum (Mo), aluminum (Al), chrome (Cr), gold (Au), silver (Ag), titanium (Ti), nickel (Ni), neodymium (Nd), tantalum (Ta), and tungsten (W), and alloys thereof.

An interlayer insulating film 140 is positioned on the gate electrode 120. The interlayer insulating film 140 consists of a silicon oxide film (SiOx), a silicon nitride film (SiNx), or multiple layers thereof, and insulates the underlying gate electrode 120. A source electrode 135*a* in contact with one side of the active layer 130 and a drain electrode 135*b* in contact with the other side of the active layer 130 are positioned on the interlayer insulating layer 140. The source electrode 135*a* and the drain electrode 135*b* may be composed of a single layer or multiple layers. The source electrode 135a and the drain electrode 135b, if composed of a single layer, may be formed of one of molybdenum (Mo), aluminum (Al), chrome (Cr), gold (Au), silver (Ag), titanium (Ti), nickel (Ni), neodymium (Nd), copper (Cu), and alloys thereof. The source electrode 135a and the drain electrode 135b, if composed of multiple layers, may be formed of two layers of molybdenum-titanium(MoTi)/copper, molybdenum/aluminum-neodymium, molybdenum/aluminum, gold/titanium, or titanium/aluminum, or three layers of molybdenum/aluminum-neodymium/molybdenum, molybdenum/aluminum/molybdenum, or titanium/aluminum/titanium.

The above-described thin-film transistor array substrate according to another aspect of the present disclosure has the same active layer configuration as the foregoing aspect of the disclosure. Thus, since the semiconducting part and the carbon allotrope part are included in the channel in the active layer, the electrons and the holes in the semiconducting part can move in proportion to the charge mobility of the semiconductor material and then move very fast in the carbon allotrope part, which is near-conductive. That is, as electrons and holes move along the semiconducting part and the carbon allotrope part, the charge mobility can be improved greatly. Notably, in the case of semiconductor materials, scattering happens when electrons move, which leads to low electron mobility. In contrast, scattering rarely occurs within carbon allotropes and this eliminates the risk of a decrease in electron mobility.

Now, a display device comprising a thin-film transistor array substrate according to the present disclosure will be described with reference to FIGS. 9 and 10. A display device comprising the thin-film transistor array substrate according to the foregoing aspect of the disclosure will be disclosed below, and a redundant explanation will be omitted.

Display Device

Referring to FIG. 9, an organic insulating film 140 is positioned on the source electrode 135a and the drain electrode 135b. The organic insulating film 140 is for smoothing out irregularities beneath components, and may be formed of an organic material such as photoacryl, polyimide, benzocyclobutene resin, and acrylate resin, etc. The organic insulating film 140 comprises a via hole 145 exposing a portion of the drain electrode 135b. Although not shown, a passivation film formed of silicon oxide (SiOx), silicon nitride (SiNx), or multiple layers thereof may be positioned on the source electrode 135a and the drain electrode 135b.

A pixel electrode 150 and a common electrode 155 are positioned on the organic insulating film 140. The pixel electrode 150 is connected to the drain electrode 135b through the via hole 145 in the organic insulating film 140. The pixel electrode 150 may be formed of a transparent and conductive material such as ITO (indium tin oxide) and IZO (indium zinc oxide). The common electrode 155 may be formed of the same material as the pixel electrode 150. The pixel electrode 150 and the common electrode 155 are arranged alternately and form a horizontal electric field between the pixel electrode 150 and the common electrode 155.

The aspects of the present disclosure have been described with respect to an IPS (in-plane switching) liquid crystal display in which a pixel electrode and a common electrode are in the same plane. However, the present disclosure is not limited to this, but instead the common electrode may be positioned under the pixel electrode or the common electrode may be positioned on a color filter array substrate opposite the thin-film transistor array substrate.

Referring to FIG. 10, a display device of the present disclosure may be an organic light-emitting display comprising an organic light-emitting diode. More specifically, an organic insulating film 140 is positioned on a source electrode 135a and a drain electrode 135b. The organic insulating film 140 comprises a via hole 145 exposing a portion of the drain electrode 135b.

A pixel electrode 150 is positioned on the organic insulating film 140. The pixel electrode 150 is connected to the drain electrode 135b through the via hole 145 in the organic insulating film 140. A bank layer 160 is positioned on the pixel electrode 150. The bank layer 160 may be a pixel definition layer that defines a pixel by partially exposing the pixel electrode 150. An organic layer 165 is positioned on the bank layer 160 and the exposed pixel electrode 150. The organic layer 165 comprises an emissive layer that emits light by recombination of an electron and a hole, and may comprise a hole injection layer, a hole transport layer, an electron transport layer, or an electron injection layer. An opposing electrode 170 is positioned on a substrate 110 where the organic film 165 is formed. The opposing electrode 170 is a cathode, and may be formed of magnesium (Mg), calcium (Ca), aluminum (Al), silver (Ag), or an alloy thereof which has a low work function. As such, an organic light-emitting diode OLED comprising the pixel electrode 150, the organic layer 165, and the opposing electrode 170 is formed.

An encapsulation layer 180 is positioned above the substrate 110 where the organic light-emitting diode OLED is formed. The encapsulation layer 180 encapsulates the substrate 110, including the underlying organic light-emitting diode OLED, and may be composed of an inorganic film, an organic film, or a multilayer structure thereof. A cover window 190 is positioned on the encapsulation layer 180 and constitutes an organic light-emitting display.

Now, test examples of an active layer comprising a carbon allotrope part and a semiconducting part according to an aspect of the present disclosure will be described. The following test examples are merely exemplary of the present disclosure, and the present disclosure is not limited to these test examples.

Test 1: Comparison of Characteristics of Pure Oxide Semiconductor and Semiconductor Combined with Graphene Example 1

Figure 11:
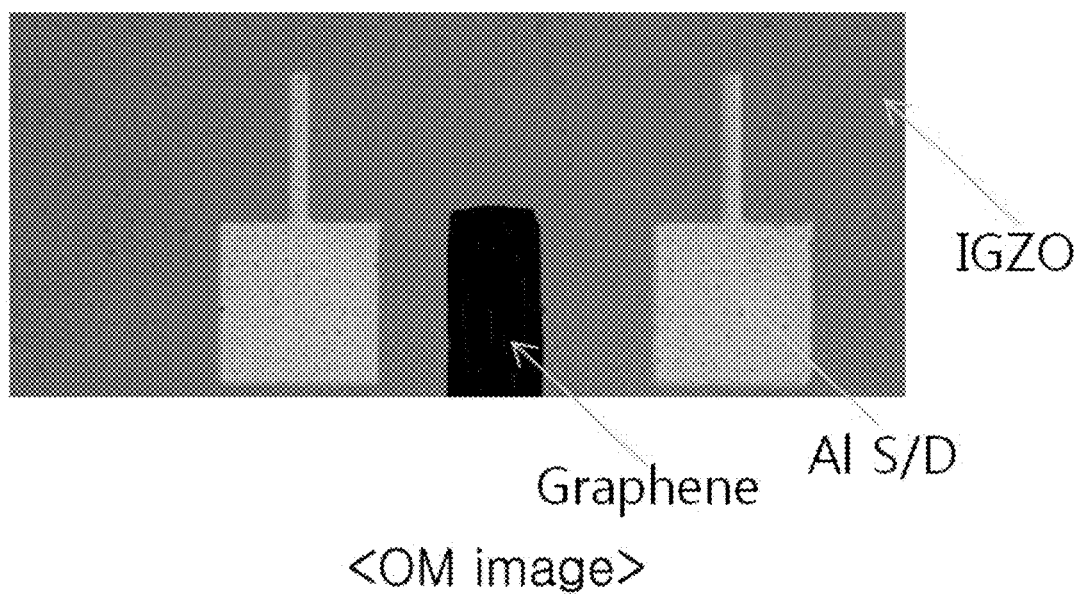
FIG. 11 is an optical image of a thin-film transistor made according to Example 1.

As shown above in FIG. 2, a thin-film transistor was made by forming an active layer comprising a semiconducting part and a carbon allotrope part in a bottom-gate type thin-film transistor. The semiconducting part was made from IGZO (i.e., indium gallium zinc oxide). An optical image of this thin-film transistor is shown in FIG. 11, from which it is clear that a thin-film transistor comprising a semiconducting part and a carbon allotrope part is made.

Comparative Example 1

A thin-film transistor was made by forming an active layer made solely from IGZO in a bottom-gate type thin-film transistor.

Current-voltage curves of the thin-film transistors made according to the above Example 1 and Comparative Example 1 are measured and shown in FIG. 12, and their threshold voltages and ON currents are shown in the following Table 1.

TABLE 1

| | Threshold Voltage (Vth, V) | ON current (A) |
|---|---|---|
| Comparative Example 1 | −25 | $4 \times 10^{-6}$ A |
| Example 1 | −15 | $1 \times 10^{-5}$ A |

Figure 12:
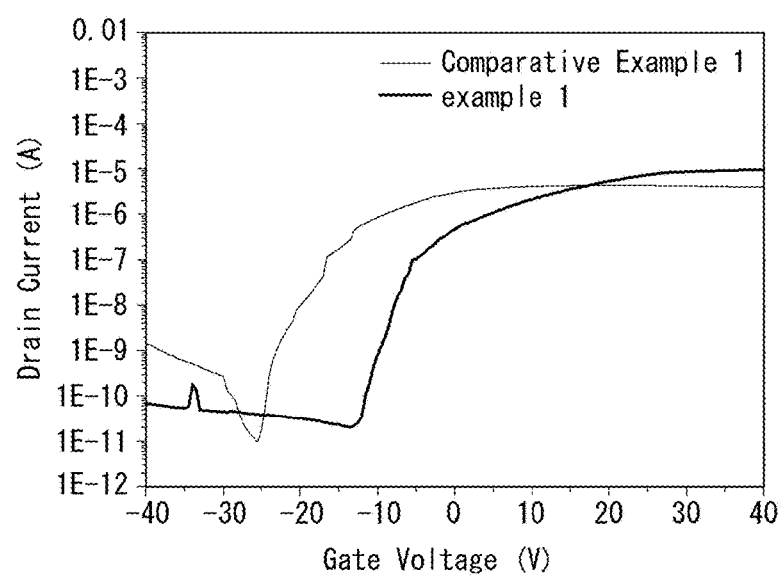
FIG. 12 is a graph showing current-voltage curves of thin-film transistors fabricated by Example 1 and Comparative Example 1.

Referring to Table 1 and FIG. 12, Comparative Example 1 with the active layer made solely from IGZO showed a threshold voltage of −25 V and an ON current of $4 \times 10^{-6}$ A. In contrast, Example 1 with the active layer comprising an IGZO semiconducting part and a carbon allotrope part shows a threshold voltage of −15 V and an ON current of $1 \times 10^{-5}$ A.

From these results, it can be concluded that the thin-film transistor comprising an IGZO semiconducting part and a carbon allotrope part have better threshold voltage and ON current characteristics compared to the thin-film transistor comprising an active layer made solely from IGZO.

Test 2: Comparison of Characteristics of Pure Graphene Semiconductor and Semiconductor Combined with Graphene and Oxide Example 2

As shown above in FIG. 4, a thin-film transistor was made by forming an active layer comprising a semiconducting part and a carbon allotrope part in a bottom-gate type thin-film transistor. The semiconducting part is made from IGZO.

Comparative Example 2

A thin-film transistor is made in the same way as the previous Example 2, except that the active layer is made solely from pure graphene.

Figure 13:
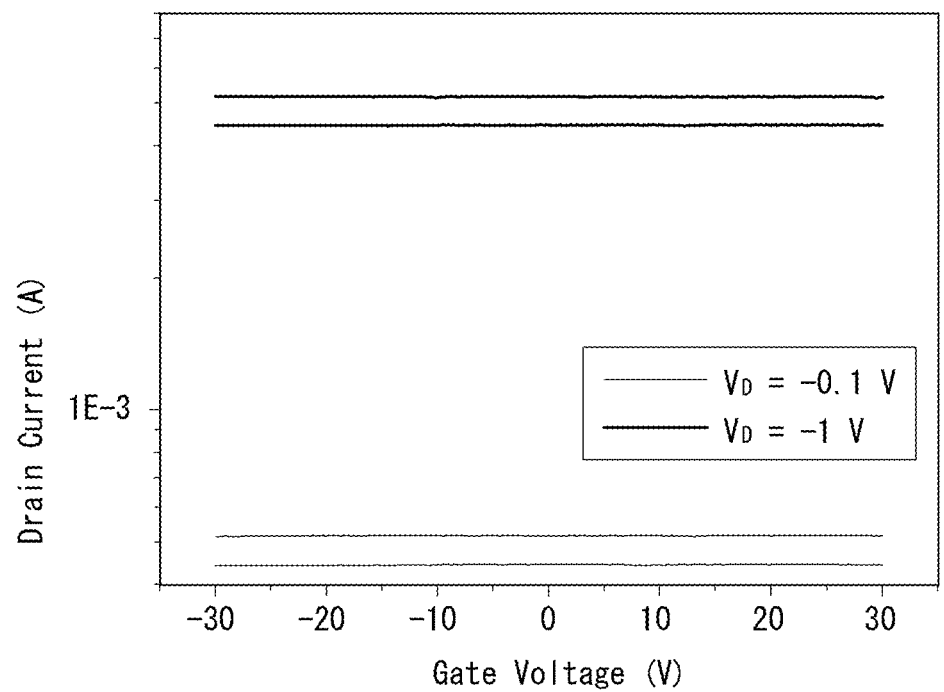
FIG. 13 is a graph showing a current-voltage curve of a thin-film transistor made according to Comparative Example 2.
Figure 14:
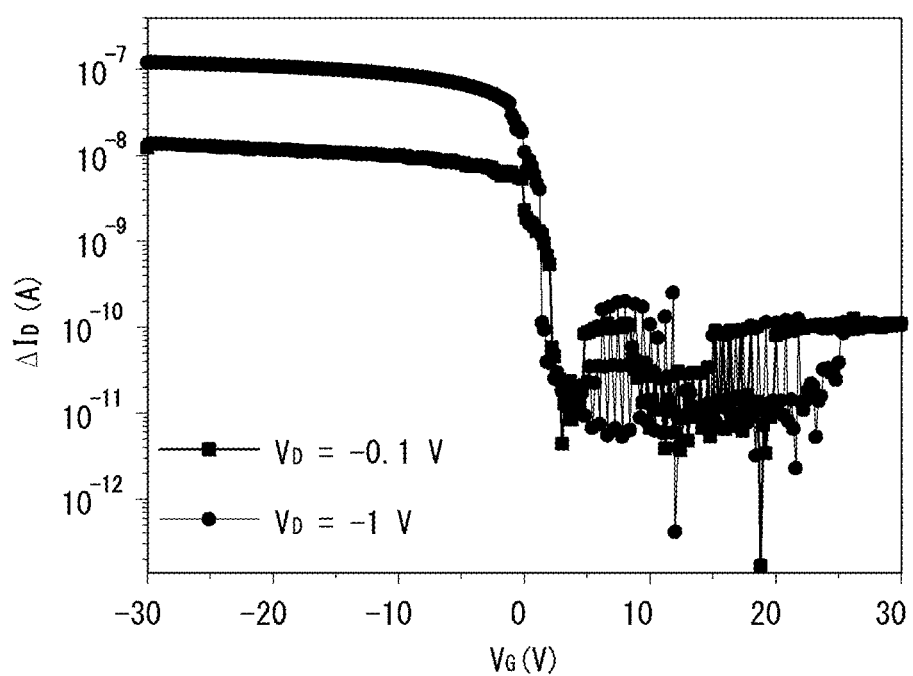
FIG. 14 is a graph showing a current-voltage curve of a thin-film transistor made according to Example 2.

A current-voltage curve of the thin-film transistor made according to the above Comparative Example 2 is measured and shown in FIG. 13, and a current-voltage curve of the thin-film transistor made according to the above Example 2 are measured and shown in FIG. 14.

Referring to FIG. 13, Comparative Example 2 with the active layer made solely from pure graphene exhibited no semiconducting properties at all but conducting properties when the drain voltage is −0.1 V or −1 V.

Referring to FIG. 14, Example 2 with the active layer consisting of a carbon allotrope part and a semiconducting part exhibited an on/off character of about 103 or greater and semiconducting properties when the drain voltage is −0.1 V or −1 V.

From these results, it can be concluded that the thin-film transistor comprising an active layer made solely from pure graphene cannot work as a thin-film transistor, whereas the thin-film transistor comprising an active layer consisting of a carbon allotrope part and a semiconducting part exhibits thin-film transistor on/off characteristics and therefore provides semiconducting properties.

As described above, in the present disclosure, since the semiconducting part and the carbon allotrope part are included in the channel in the active layer, the electrons and the holes in the semiconducting part can move in proportion to the charge mobility of the semiconductor material and then move very fast in the carbon allotrope part which is near-conductive. Thus, as electrons and holes move along the carbon allotrope part in the channel in the active layer, the charge mobility can be improved greatly.

Moreover, while typical semiconductor materials have a low electron mobility due to scattering, which happens when electrons move, the present disclosure can prevent a decrease in electron mobility since the active layer has a carbon allotrope part with little scattering.

Although aspects of the disclosure have been described with reference to a number of illustrative examples thereof, it should be understood that numerous other modifications and aspects can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An active layer comprising: at least one semiconductor material part and at least one carbon allotrope part, wherein the at least one carbon allotrope part is laterally disposed on a same plane as the at least one semiconductor material part and laterally contacts the at least one semiconductor material part, and both the at least one carbon allotrope part and the at least one semiconductor material part have a portion to be an outmost layer of the active layer, wherein the at least one semiconductor material part has a first length long enough to cause scattering of electron and the at least one carbon allotrope part has a second length long enough to reduce the scattering of electron for the active layer to function as a semiconductor when a voltage is applied, wherein the at least one carbon allotrope part includes first and second carbon allotrope parts aligned with an outmost portion of the at least one semiconductor material part, and the at least one semiconductor material part directly contacts the first and second carbon allotrope parts in both lateral and vertical directions to enhance an electron-hole mobility, and wherein the at least one semiconductor material part includes a horizontal portion and a vertical portion that cross each other.

2. The active layer of claim 1, wherein the at least one carbon allotrope part comprises a plurality of domains.

3. The active layer of claim 2, wherein each domain is formed by chemical bonding between carbon atoms in the carbon allotrope part.

4. The active layer of claim 1, wherein the at least one carbon allotrope part has a one-dimensional or two-dimensional structure.

5. The active layer of claim 1, wherein the at least one carbon allotrope part includes one of reduced graphene oxide (rGO), unoxidized graphene, graphene nanoribbons, carbon nanotube and mixtures thereof.

6. The active layer of claim 1, wherein the at least one semiconductor material parts includes one of a ceramic semiconductor, an organic semiconductor material, a transition metal dichalcogenide, and a mixture thereof.

7. The active layer of claim 2, wherein the at least one semiconducting part is positioned in a channel.

8. The active layer of claim 2, wherein the at least one carbon allotrope part is positioned in a channel.

9. The active layer of claim 2, wherein the at least one semiconducting part is positioned between two carbon allotrope parts.

10. The active layer of claim 2, wherein the at least one carbon allotrope part is positioned between two semiconducting parts.

11. A thin-film transistor array substrate comprising:
a substrate;
a gate electrode on the substrate;
a gate insulating film on the gate electrode;
an active layer positioned on the gate insulating film and comprising at least one semiconductor material part and at least one carbon allotrope part, wherein the at least one carbon allotrope part is laterally disposed on a same plane as the at least one semiconductor material part and laterally contacts the at least one semiconductor material part, and both the at least one carbon allotrope part and the at least one semiconductor material part have a portion to be an outmost layer of the active layer;
source and drain electrodes in contact with the active layer,
wherein the at least one carbon allotrope part includes first and second carbon allotrope parts aligned with an outmost portion of the at least one semiconductor material part, and the at least one semiconductor material part directly contacts the first and second carbon allotrope parts in both lateral and vertical directions to enhance an electron-hole mobility, and
wherein the source and drain electrodes directly contact the first and second carbon allotrope parts and one of the at least one semiconductor material part located between the first and second carbon allotrope parts, and
wherein the at least one semiconductor material part includes a horizontal portion and a vertical portion that cross each other.

12. The thin-film transistor array substrate of claim 11, wherein the at least one carbon allotrope part comprises a plurality of domains.

13. The thin-film transistor array substrate of claim 12, wherein each of the plurality of domains is formed by chemical bonding between carbon atoms in the carbon allotrope part.

14. The thin-film transistor array substrate of claim 11, wherein the at least one carbon allotrope part includes one of reduced graphene oxide (rGO), unoxidized graphene, graphene nanoribbons, carbon nanotube and mixtures thereof.

15. The thin-film transistor array substrate of claim 11, wherein the at least one semiconductor material parts includes one of a ceramic semiconductor, an organic semiconductor material, a transition metal dichalcogenide, and a mixture thereof.

16. The thin-film transistor array substrate of claim 11, wherein the at least one semiconducting part is positioned in a channel.

17. The thin-film transistor array substrate of claim 11, wherein the at least one carbon allotrope part is positioned in a channel.

18. A display device comprising:
a substrate;
a gate electrode on the substrate;
a gate insulating film on the gate electrode;
an active layer positioned on the gate insulating film and comprising at least one semiconductor material part and at least one carbon allotrope part, wherein the at least one carbon allotrope part is laterally disposed on a same plane as the at least one semiconductor material part and laterally contacts the at least one semiconductor material part, and both the at least one carbon allotrope part and the at least one semiconductor material part have a portion to be an outmost layer of the active layer;
a source and drain electrodes in contact with the active layer, and each of the source electrode and the drain electrode is directly in contact with the at least one semiconductor material part and the at least one carbon allotrope part;
an organic insulating film on the source and drain electrodes including the gate insulating film; and
a pixel electrode on the organic insulating film,
wherein the at least one semiconductor material part has a first length long enough to cause scattering of electron, and the at least one carbon allotrope part has a second length long enough to reduce the scattering of electron in the active layer to function as a semiconductor when a voltage is applied,
wherein the at least one carbon allotrope part includes first and second carbon allotrope parts aligned with an outmost portion of the at least one semiconductor material part, and the at least one semiconductor material part directly contacts the first and second carbon allotrope parts in both lateral and vertical directions to enhance an electron-hole mobility,
wherein the source and drain electrodes directly contact the first and second carbon allotrope parts and one of the at least one semiconductor material part located between the first and second carbon allotrope parts, and
wherein the at least one semiconductor material part includes a horizontal portion and a vertical portion that cross each other.

19. The display device of claim 18, further comprising:
an organic light-emitting diode electrically connected to the pixel electrode;
an encapsulation layer on the organic light-emitting diode; and
a cover window on the encapsulation layer.

20. The display device of claim 18, further comprising:
a common electrode positioned in the same plane as the pixel electrode or under the pixel electrode, spaced apart from the pixel electrode; and
a liquid crystal layer on the common electrode.

21. The thin-film transistor array substrate of claim 11, wherein a portion of the carbon allotrope contacting the source electrode and a portion of the carbon allotrope contacting the drain electrode partially correspond to each other.

22. The thin-film transistor array substrate of claim 11, wherein an area of a portion of the carbon allotrope contacting the source electrode and an area of a portion of the carbon allotrope contacting the drain electrode is the same.

23. The thin-film transistor array substrate of claim 11, wherein each of the source electrode and the drain electrode is contacted with two the carbon allotrope parts and one the semiconductor material part between two the carbon allotrope parts.

24. The thin-film transistor array substrate of claim 18, wherein a portion of the carbon allotrope contacting the source electrode and a portion of the carbon allotrope contacting the drain electrode partially correspond to each other.

25. The thin-film transistor array substrate of claim 18, wherein an area of a portion of the carbon allotrope contacting the source electrode and an area of a portion of the carbon allotrope contacting the drain electrode is the same.

26. The thin-film transistor array substrate of claim 18, wherein each of the source electrode and the drain electrode is contacted with two the carbon allotrope parts and one the semiconductor material part between two the carbon allotrope parts.

27. The thin-film transistor array substrate of claim 11, wherein the first and the second carbon allotrope parts contacting the source electrode are disposed apart from each other with the horizontal portion interposed therebetween, and the first and the second carbon allotrope parts contacting the drain electrode are disposed apart from each other with the horizontal portion interposed therebetween.

28. The thin-film transistor array substrate of claim 11, wherein one side of the horizontal portion contacts the source electrode and the other side of the horizontal portion contacts the drain electrode.

29. The thin-film transistor array substrate of claim 18, wherein the first and the second carbon allotrope parts contacting the source electrode are disposed apart from each other with the horizontal portion interposed therebetween, and the first and the second carbon allotrope parts contacting the drain electrode are disposed apart from each other with the horizontal portion interposed therebetween.

30. The thin-film transistor array substrate of claim 18, wherein one side of the horizontal portion contacts the source electrode and the other side of the horizontal portion contacts the drain electrode.

* * * * *